United States Patent
Nickel et al.

(10) Patent No.: US 6,989,975 B2
(45) Date of Patent: Jan. 24, 2006

(54) MAGNETORESISTIVE DEVICE INCLUDING PINNED STRUCTURE WITH A LAYER THAT PROVIDES TEXTURE FOR PINNING

(75) Inventors: Janice H. Nickel, Sunnyvale, CA (US); Manish Sharma, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 163 days.

(21) Appl. No.: 10/463,993

(22) Filed: Jun. 18, 2003

(65) Prior Publication Data

US 2004/0257718 A1    Dec. 23, 2004

(51) Int. Cl.
G11B 5/39    (2006.01)
(52) U.S. Cl. ................................. 360/324.11
(58) Field of Classification Search ........... 360/324.11, 360/324.2
See application file for complete search history.

(56) References Cited

U.S. PATENT DOCUMENTS

| | | | | |
|---|---|---|---|---|
| 5,801,984 | A * | 9/1998 | Parkin ........................ 365/158 |
| 6,219,209 | B1 * | 4/2001 | Gill ........................ 360/324.11 |
| 6,356,419 | B1 * | 3/2002 | Gill ........................ 360/324.11 |
| 6,418,048 | B1 * | 7/2002 | Sin et al. ..................... 365/173 |
| 6,583,969 | B1 * | 6/2003 | Pinarbasi ................ 360/324.11 |
| 6,721,144 | B2 * | 4/2004 | Carey et al. ........... 360/324.11 |
| 6,785,102 | B2 * | 8/2004 | Freitag et al. ......... 360/324.11 |
| 2001/0006445 | A1 * | 7/2001 | Pinarbasi ................ 360/324.11 |
| 2001/0009063 | A1 * | 7/2001 | Saito et al. .............. 29/603.08 |
| 2001/0030842 | A1 * | 10/2001 | Pinarbasi ................ 360/324.11 |
| 2001/0030887 | A1 * | 10/2001 | Ishikawa et al. ............. 365/158 |
| 2002/0034094 | A1 * | 3/2002 | Saito et al. ................. 365/158 |
| 2002/0097540 | A1 * | 7/2002 | Hayashi et al. ........ 360/324.12 |
| 2002/0135923 | A1 * | 9/2002 | Gill ........................ 360/73.03 |
| 2002/0135952 | A1 * | 9/2002 | Gill ........................ 360/324.11 |
| 2002/0196588 | A1 * | 12/2002 | Gill ........................ 360/314 |
| 2003/0002229 | A1 * | 1/2003 | Pinarbasi ................. 360/324.2 |
| 2003/0006764 | A1 * | 1/2003 | Kou ........................... 324/252 |
| 2003/0072109 | A1 * | 4/2003 | Sharma et al. ........... 360/324.2 |
| 2004/0184311 | A1 * | 9/2004 | Sharma ...................... 365/158 |

* cited by examiner

Primary Examiner—Jefferson Evans

(57) ABSTRACT

A magnetoresistive device includes a free ferromagnetic layer; a pinned structure; and a spacer layer between the free layer and the pinned structure. The pinned structure may include first, second and third ferromagnetic layers that are ferromagnetically coupled. The first and third layers are separated by the second layer. The second layer has a lower magnetic moment than the first and third layers. In the alternative, the pinned structure may include a single layer of $Co_{50}Fe_{50}$.

18 Claims, 4 Drawing Sheets

US 6,989,975 B2

MAGNETORESISTIVE DEVICE INCLUDING PINNED STRUCTURE WITH A LAYER THAT PROVIDES TEXTURE FOR PINNING

BACKGROUND

Magnetic tunnel junctions can be used as memory elements in magnetic random access memory ("MRAM") devices. MRAM has lower power consumption than short-term memory such as DRAM, SRAM and Flash memory. MRAM can perform read and write operations much faster (by orders of magnitude) than conventional long-term storage devices such as hard drives. In addition, MRAM is more compact and consumes less power than hard drives.

Magnetic tunnel junctions can be used as magnetic sensors in read heads of hard disk drives. The magnetic tunnel junctions can generate stronger signals than giant magnetoresistive devices and other conventional devices.

A conventional magnetic tunnel junction includes a pinned ferromagnetic layer, a free ferromagnetic layer and an insulating tunnel barrier sandwiched between the ferromagnetic layers. Relative orientation and magnitude of spin polarization of the ferromagnetic layers determine the resistance of the magnetic tunnel junction. Generally, a magnetic tunnel junction has a nominal resistance ($R_N$) when its magnetization orientation is parallel, and a higher resistance ($R_N+\Delta R_N$) when its magnetization orientation is anti-parallel.

A logic value may be stored in a magnetic tunnel junction by setting the magnetic tunnel junction to a desired magnetization orientation; and the logic value may be read by sensing the resistance state of the magnetic tunnel junction. However, it can be difficult to distinguish between the two resistance states.

It would be desirable to improve the ability to distinguish between the resistance states. Improving this ability could improve MRAM performance, reduce fabrication cost, and reduce the complexity of read operations.

SUMMARY

According to one aspect of the present invention, a magnetoresistive device includes a free ferromagnetic layer; a pinned structure; and a spacer layer between the free layer and the pinned structure. The pinned structure includes first, second and third ferromagnetic layers that are ferromagnetically coupled. The first and third layers are separated by the second layer. The second layer has a lower magnetic moment than the first and third layers.

According to another aspect of the invention, a magnetoresistive device includes a free ferromagnetic layer; a pinned structure; and a spacer layer between the free layer and the pinned structure. The pinned structure includes at least one ferromagnetic layer of $Co_{50}Fe_{50}$.

Other aspects and advantages of the present invention will become apparent from the following detailed description, taken in conjunction with the accompanying drawings, illustrating by way of example the principles of the present invention.

DETAILED DESCRIPTION

Figure 1:
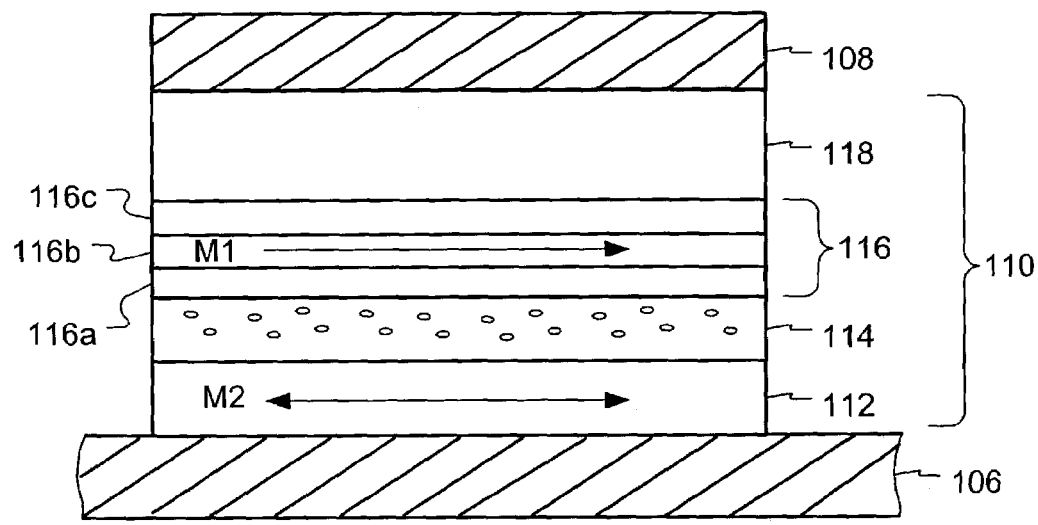
FIG. 1 is an illustration of a magnetoresistive device according to a first embodiment of the present invention.

Reference is made to FIG. 1, which illustrates a top-pinned magnetic tunnel junction 110. The magnetic tunnel junction 110 includes a free ferromagnetic layer 112, a spacer layer 114 formed on the free layer 112, a pinned structure 116 formed on the spacer layer 114, and an antiferromagnetic (AF) pinning layer 118 formed on the pinned structure 116. The magnetic tunnel junction 110 is considered top-pinned because the pinned structure 116 is formed after the free layer 112.

The pinned structure 116 includes the following three ferromagnetic layers: a first ferromagnetic layer 116a on the spacer layer 114; a second ferromagnetic layer 116b on the first ferromagnetic layer 116a; and a third ferromagnetic layer 116c on the second ferromagnetic layer 116b. The second ferromagnetic layer 116b is in intimate contact (i.e., no spacers or barriers) with the first and third layers 116a and 116c. With these multiple ferromagnetic layers 116a, 116b and 116c in intimate contact, the ferromagnetic coupling between these layers is so strong that a combined magnetization vector (M1) results.

The AF pinning layer 118 provides a large exchange field, which pins the magnetization vector (M1) of the pinned structure 116. Consequently, the pinned magnetization vector (M1) is fixed in a plane so as not to rotate in the presence of an applied magnetic field in a range of interest.

The free layer 112 has a magnetization vector (M2) that is allowed to rotate in the presence of the applied magnetic field in the range of interest. The magnetic field may be applied by bottom and top conductors 106 and 108. The free magnetization vector (M2) may be allowed to change between two stable orientations. In one stable orientation, the magnetization vectors (M1 and M2) are pointing in the same direction, and the magnetic tunnel junction 110 is said to have a parallel magnetization orientation. In the other stable orientation, the magnetization vectors (M1 and M2) are pointing in opposite directions, and the magnetic tunnel junction 110 is said to have an anti-parallel magnetization orientation.

The spacer layer 114 includes an insulating tunnel barrier, which allows quantum mechanical tunneling to occur between the pinned structure 116 and the free layer 112. This tunneling phenomenon is electron spin dependent, making the resistance across the pinned structure 116 and the free layer 112 (i.e., the perpendicular-plane resistance) a function of the relative orientation of the magnetization vectors (M1 and M2). Generally, the resistance of the magnetic tunnel junction 110 is a first value ($R_N$) when the magnetization vectors (M1 and M2) point in the same direction, and the resistance is increased to a second value ($R_N+\Delta R_N$) when the magnetization vectors (M1 and M2) point in opposite directions. The ratio $\Delta R_N/R_N$ is referred to as the tunneling magnetoresistance ratio (TMR) of the magnetic tunnel junction 110.

The pinned structure 116 has the following characteristics: high spin polarization, good seeding for the overlaying AF pinning layer 118, and high exchange coupling while minimizing fringe fields. The good seeding provides the proper crystal orientation for the AF pinning layer 118. The high spin polarization results in good tunneling magnetoresistance, and the high exchange coupling results in stable magnetization orientations in the applied field of interest.

The first ferromagnetic layer 116a of the pinned structure 116 provides the high spin polarization and the good seeding. The second ferromagnetic layer 116b propagates the good seeding to the third ferromagnetic layer 116c. The third ferromagnetic layers 116c provides the high exchange coupling.

The second ferromagnetic layer 116b also has a lower magnetic moment than the first and third ferromagnetic layers 116a and 116c. Lowering the magnetic moment of the second ferromagnetic layer 116b can reduce fringe fields at edges of the pinned structure 116. (Since the top-pinned magnetic tunnel junction 110 will typically be patterned, fringe fields will result.) Reducing the fringe fields can improve switching characteristics of the free layer 112 and thereby improve the performance of the magnetic tunnel junction 110.

These characteristics, as well as the lower magnetic moment of the second layer 116b, can be satisfied by proper selection of materials for the three ferromagnetic layers 116a–116c of the pinned structure 116. The first layer 116a may include Fe and Co (e.g., CoFe, an alloy of Co and Fe), which gives high spin polarization. The third layer 116c may also include Fe and Co (e.g., CoFe, an alloy of Co and Fe), which also has high exchange coupling. Co alloys typically have a higher coercivity and higher moment. At the same time, Co alloys have higher exchange coupling constants with most AF materials (i.e., Co alloys give higher exchange bias).

The second (bulk) layer 116b may be made of a material such as NiFe, which propagates the seeding for the overlaying AF pinning layer 118. The NiFe also has a lower magnetization (i.e., a lower magnetic moment per unit volume for a given material) than the CoFe.

The second layer 116b is not limited to NiFe. Other iron alloys having a lower magnetization than CoFe may be used. For example, alloys of Zr, Ta, Nb, Hf, B, Mn, or Cr may be used.

However, the use of the NiFe offers an additional advantage. An alloy such as NiFe has a lower coercivity than CoFe and, consequently, can reduce the coercivity and dispersion in the pinned structure 116, and can increase the exchange bias of the magnetic tunnel junction 110.

The pinned structure 116 is not limited to any particular ratio of cobalt-to-iron and nickel-to-iron. An exemplary pinned structure 116 includes a first layer 116a of $Co_{50}Fe_{50}$, a second layer 116b of $Ni_{80}Fe_{20}$, and a third layer of $Co_{50}Fe_{50}$.

Figure 2:
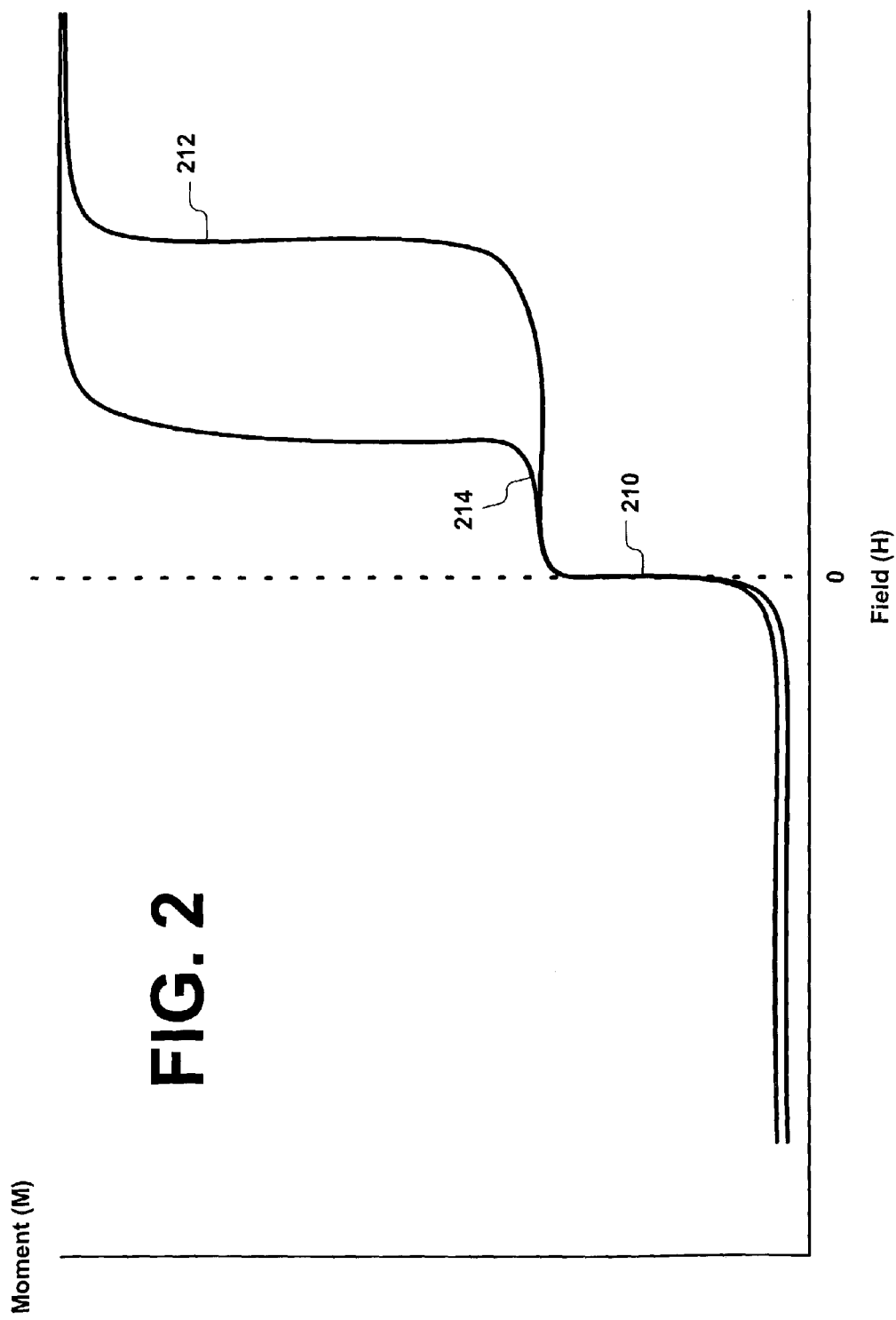
FIG. 2 is an illustration of M-H curves for a free layer and a pinned structure of the magnetoresistive device of FIG. 1.

Additional reference is made to FIG. 2. The free layer 112 has a narrow hysteresis loop 210, and the pinned structure 116 has a wider hysteresis loop 212. The distance between these two loops is referred to as the exchange bias.

The pinned hysteresis loop 212 has a tail 214, which characterizes dispersion in the pinned structure 116. Higher energy alloys such as CoFe have higher dispersion than alloys such as NiFe. The dispersion results from individual domains having an angular distribution. Annealing in the presence of a magnetic field can reduce the dispersion, but this becomes harder for larger tails.

It is not desirable for the tail 214 of the pinned loop 212 to overlap or otherwise encroach the free loop 210. If the tail of the pinned loop 212 encroaches the free loop 210, the pinned magnetization vector (M2) can start rotating when a magnetic field in the range of interest is applied to the magnetic tunnel junction 110. If the pinned magnetization vector (M1) starts rotating, the tunneling magnetoresistance can be reduced. In addition, the pinning of the pinning layer 118 can be degraded and its reference eventually lost. Increasing the exchange bias shifts the tail of the pinned loop 212 away from the free loop 210, thus preventing the tail from encroaching the free loop 210. In turn, tunneling magnetoresistance of the magnetic tunnel junction 110 is increased.

Figure 3:
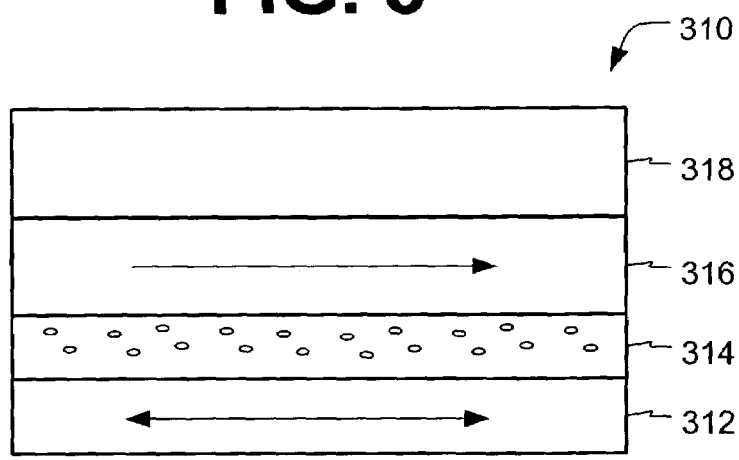
FIG. 3 is an illustration of a magnetoresistive device according to a second embodiment of the present invention.

An alternative embodiment of a magnetic tunnel junction 310 is shown in FIG. 3. The magnetic tunnel junction of FIG. 3 includes a free layer 312, a spacer layer 314, a pinned structure 316 and an AF pinning layer 318. The pinned structure 316 consists of a single layer of $Co_{50}Fe_{50}$. The $Co_{50}Fe_{50}$ layer provides a good seed layer for the AF pinning layer. The $Co_{50}Fe_{50}$ layer also possesses the high exchange coupling and high spin polarization.

Figure 4:
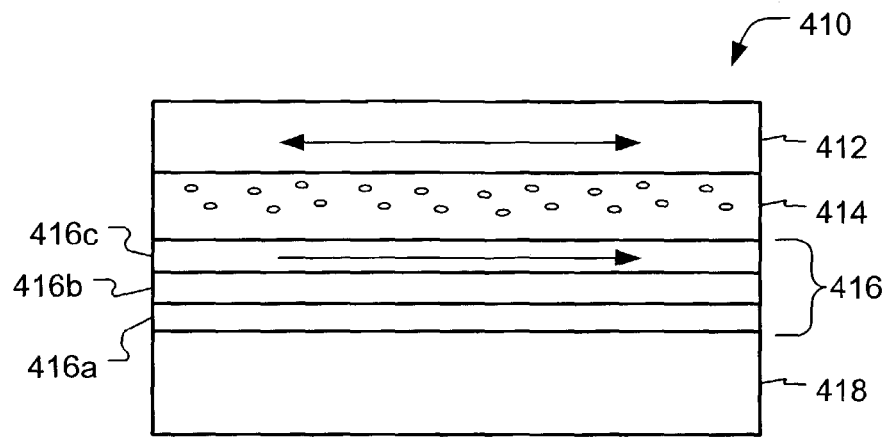
FIG. 4 is an illustration of a magnetoresistive device according to a third embodiment of the present invention.

The present invention is not limited to a magnetic tunnel junction that is top-pinned. FIG. 4 shows a bottom-pinned magnetic tunnel junction 410 according to the present invention. In the bottom-pinned magnetic tunnel junction 410, a pinned structure 416 having multiple ferromagnetic layers 416a, 416b, 416c may be used. The first layer 416a, which is on an AF pinning layer 418, can have a high exchange coupling; the third layer 416c, which is closest to an insulating tunnel barrier 414, can have a high spin polarization; and the second layer 416b, which is between the first and third layers 416a and 416c, can have a lower magnetic moment than the first and third layers 416a and 416c. The second layer 416b need not propagate seeding, since the AF pinning layer 418 is beneath it. A free ferromagnetic layer 412 is formed on the insulating tunnel barrier 414.

The present invention is not limited to magnetic tunnel junctions; the present invention covers other types of magnetoresistive devices. For example, a magnetoresistive device according to the present invention may be a top-pinned or bottom-pinned GMR device. A GMR device has the same basic configuration as a magnetic tunnel junction, except that the free layer and pinned structure are separated by a conductive non-magnetic metallic layer instead of an insulating tunnel barrier; and that resistance of the GMR device changes in-plane instead of perpendicular-plane. Exemplary spacer layer metals include gold, silver and copper. The relative magnetization orientations of the free layer and pinned structure affect in-plane resistance of a GMR device.

Although the pinned structure is described above as having three ferromagnetic layers, it is not so limited. The pinned structure may include additional layers. A five-layer pinned structure, for example, might have the following layers: CoFe/NiFe/CoFe/NiFe/CoFe.

Although the first and third layers of the pinned structure are described as being made of the same material, the pinned structure is not so limited. The different layers may be made of different materials.

The magnetoresistive devices described above are not limited to any particular application. One exemplary application is an MRAM device.

Figure 5:
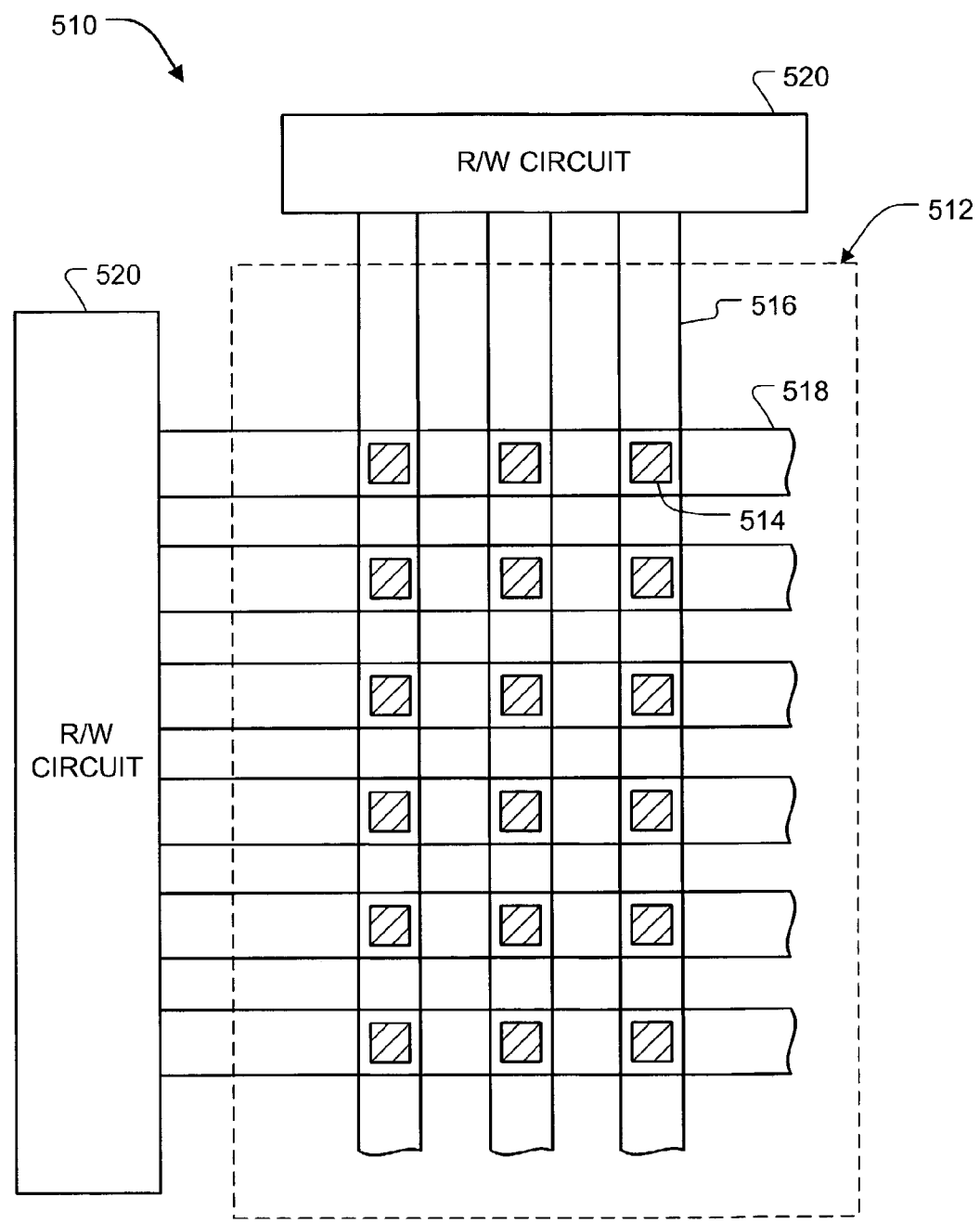
FIG. 5 is an illustration of an MRAM device according to an embodiment of the present invention.

FIG. 5 illustrates an MRAM device 510 including an array 512 of memory cells 514. Each memory cell 514 may include a magnetic tunnel junction according to the present invention. Only a relatively small number of memory cells 514 are shown to simplify the description of the MRAM device 510. In practice, arrays 512 of other sizes may be used.

Word lines 516 extend along rows of the memory cells 514, and bit lines 518 extend along columns of the memory cells 514. There may be one word line 516 for each row of the array 512 and one bit line 518 for each column of the array 512. Each memory cell 514 is located at a cross point of a word line 516 and bit line 518. Thus each magnetic tunnel junction is located at the cross point of a word line 516 and a bit line 518.

The MRAM device 510 also includes a read/write circuit 520 for performing read and write operations on selected memory cells 514. During write operations, the read/write circuit 520 supplies write currents to the word and bit lines 516 and 518 crossing a selected memory cell 514. The write currents create magnetic fields that, when combined, cause the free layer of the selected memory cell 514 to switch cleanly (the word and bit lines 516 and 518 serve the same function as the top and bottom conductors 106 and 108 of FIG. 1).

During read operations, the read/write circuit 520 may apply a voltage across the word and bit lines 516 and 518 crossing the memory cell 514, causing a sense current to flow through the magnetic tunnel junction of the selected memory cell 514. The sense current indicates the resistance state (either $R_N$ or $R_N+\Delta R_N$).

Although each memory cell 514 was described as having only a single magnetic tunnel junction, the present invention is not so limited. Each memory cell 514 may include one or more magnetic tunnel junctions, or each memory cell 514 may include one or more of another type of magnetoresistive device.

The present invention is not limited to magnetoresistive devices having two stable orientations or devices having magnetization vectors M1 and M2 extending in the same direction. The magnetization vector (M2) of the free layer could be orthogonal to the magnetization vector (M1) of the pinned structure.

Consider the resistance of a magnetic tunnel junction having orthogonal magnetization vectors (M1 and M2). This magnetic tunnel junction has a resistance that varies as the free magnetization vector (M2) is rotated from one direction to the other. Its R-H transfer curve has a region that is roughly linear. An exemplary application for such a magnetic tunnel junction is a hard disk drive.

Figure 6:
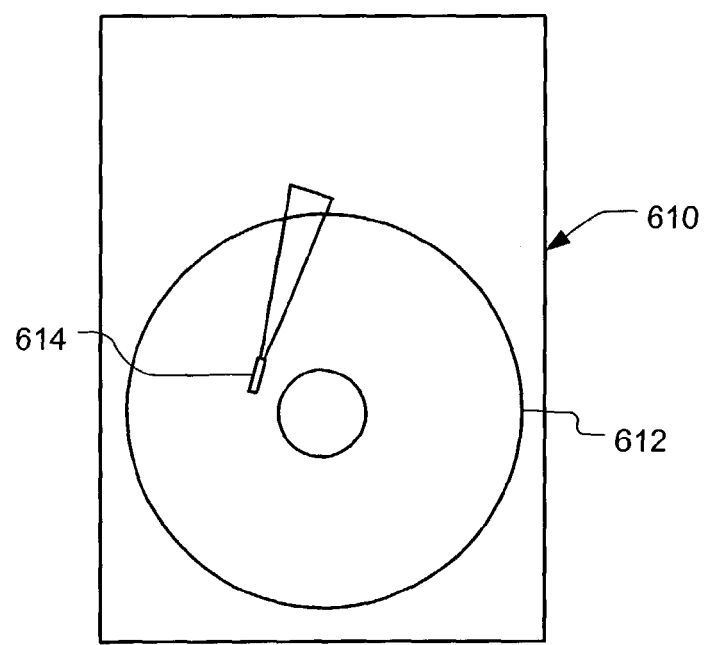
FIG. 6 is an illustration of a hard disk drive according to an embodiment of the present invention.

Reference is now made to FIG. 6, which shows a hard disk drive 610 including magnetic media disks 612. User data is stored in concentric circular tracks on the surface of each disk 612. The disk drive 610 also includes transducers 614 for performing read and write operations on the disks 612. Each transducer 614 includes a magnetoresistive device according to the present invention for the read operations (each transducer 614 may also include a thin film inductive head for the write operations). During read operations, the magnetoresistive device would be operated in the linear region of its transfer curve.

The present invention is not limited to the specific embodiments described and illustrated above. Instead, the present invention is construed according to the claims that follow.

What is claimed is:

1. A top-pinned magnetoresistive device comprising:
a free ferromagnetic layer;
an insulating tunnel barrier atop the free layer; and
a pinned structure atop the insulating tunnel barrier, the pinned structure including first, second and third ferromagnetic layers that are ferromagnetically coupled, the second layer having a lower magnetic moment than the first and third layers, the first ferromagnetic layer made of a material that provides high spin polarization and texture for pinning.

2. The device of claim 1, wherein the second layer is in intimate contact with the first and third layers.

3. The device of claim 1, further comprising an antiferromagnetic pinning layer on the pinned structure.

4. The device of claim 1, wherein the first and third layers include Co and Fe; and wherein the second layer includes Ni and Fe.

5. The device of claim 1, wherein the first and third layers are made of $Co_{50}Fe_{50}$.

6. The device of claim 5, wherein the second layer is made of $Ni_{80}Fe_{20}$.

7. A read head for a hard disk drive, the read head including the device of claim 1.

8. A hard disk drive including at least one device of claim 1.

9. A magnetoresistive device comprising a free ferromagnetic layer; a pinned structure; and a spacer layer between the free layer and the pinned structure; wherein the pinned structure includes first, second and third ferromagnetic layers that are ferromagnetically coupled, wherein the first and third layers are separated by the second layer, the second layer having a lower magnetic moment than the first and third layers; and wherein the first ferromagnetic layer provides high spin polarization and texture for pinning, the second ferromagnetic layer propagates the texture to the third ferromagnetic layer, and the third ferromagnetic layer provides high exchange coupling.

10. A memory cell of a data storage device, the memory cell including at least one magnetoresistive device comprising a free ferromagnetic layer; a pinned structure; and a spacer layer between the free layer and the pinned structure; wherein the pinned structure includes first, second and third ferromagnetic layers that are ferromagnetically coupled, the first and third layers separated by the second layer, the second layer having a lower magnetic moment than the first and third layers.

11. An MRAM device comprising an array of memory cells; a plurality of first conductors extending along rows of the memory cell array; and a plurality of conductors extending along columns of the memory cell array, each memory cell at a cross point of one of the first conductors and one of the second conductors, each memory cell including at least one magnetoresistive device comprising a free ferromagnetic layer; a pinned structure; and a spacer layer between the free layer and the pinned structure; wherein the pinned structure includes first, second and third ferromagnetic layers that are ferromagnetically coupled, the first and third layers separated by the second layer, the second layer having a lower magnetic moment than the first and third layers.

12. The MRAM device of claim 11, further comprising a read/write circuit for setting magnetization orientations of selected memory cells during write operations and reading resistance states of selected memory cells during read operations.

13. A pinned structure for a magnetoresistive device, the structure comprising:
a first ferromagnetic layer made of $Co_{50}Fe_{50}$;
a second ferromagnetic layer on the first ferromagnetic layer, the second layer made of $Ni_{80}Fe_{20}$; and
a third ferromagnetic layer on the second ferromagnetic layer, the third layer made of $Co_{50}Fe_{50}$;
the second ferromagnetic layer having a lower magnetic moment than the first and third ferromagnetic layers;

the first, second, and third layers ferromagnetically coupled.

14. The pinned structure claim 13, wherein the second layer is in intimate contact with the first and third layers.

15. A pinned structure for a magnetoresistive device, the structure comprising:
a first ferromagnetic layer that provides high spin polarization and a desired texture;
a second ferromagnetic layer on the first ferromagnetic layer; and
a third ferromagnetic layer on the second ferromagnetic layer;
the first, second, and third layers ferromagnetically coupled;
the second ferromagnetic layer having a lower magnetic moment than the first and third ferromagnetic layers;
the second ferromagnetic layer propagating the texture to the third ferromagnetic layer;
the third ferromagnetic layer providing high exchange coupling.

16. A top-pinned magnetoresistive device comprising:
a free ferromagnetic layer;
a spacer layer on the free layer;
a pinned structure consisting of a single layer of $Co_{50}Fe_{50}$ on the spacer layer; and
a pinning layer on the pinned structure;
wherein the single layer of $Co_{50}Fe_{50}$ is in intimate contact with the spacer layer and provides a seed layer for the pinning layer.

17. A magnetoresistive device comprising:
a free ferromagnetic layer;
a pinned structure including first and third layers made of the $Co_{50}Fe_{50}$, and a second ferromagnetic layer between the first and third layers, the second layer having a lower magnetic moment than the first and third layers, the first, second and third layers ferromagnetically coupled; and
a spacer layer between the free layer and the pinned structure.

18. The device of claim 17, wherein the second layer is made of $Ni_{80}Fe_{20}$.

* * * * *